(12) United States Patent
Kohamada

(10) Patent No.: US 8,395,424 B2
(45) Date of Patent: Mar. 12, 2013

(54) SEMICONDUCTOR DEVICE AND OPERATION MODE SWITCH METHOD

(75) Inventor: Hiroyuki Kohamada, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 13/474,499

(22) Filed: May 17, 2012

(65) Prior Publication Data

US 2012/0229188 A1 Sep. 13, 2012

Related U.S. Application Data

(63) Continuation of application No. 12/654,381, filed on Dec. 17, 2009, now Pat. No. 8,207,761.

(30) Foreign Application Priority Data

Dec. 19, 2008 (JP) .................................. 2008-324581

(51) Int. Cl.
 *H03K 3/00* (2006.01)
(52) U.S. Cl. ........................... 327/112; 327/18; 714/733
(58) Field of Classification Search .................... 327/18, 327/20, 22, 23, 143, 112; 714/733
 See application file for complete search history.

(56) References Cited

U.S. PATENT DOCUMENTS

| | | | | |
|---|---|---|---|---|
| 3,322,974 A | * | 5/1967 | Ahrons et al. | 327/211 |
| 3,769,523 A | * | 10/1973 | Suzuki | 326/122 |
| 4,031,410 A | * | 6/1977 | Kikuchi | 326/60 |
| 4,100,429 A | * | 7/1978 | Adachi | 326/60 |
| 4,115,706 A | * | 9/1978 | Yamaguchi | 326/60 |
| 4,710,730 A | | 12/1987 | Doyle | |
| 5,198,707 A | * | 3/1993 | Nicolai | 326/98 |
| 5,382,843 A | * | 1/1995 | Gucyski | 326/109 |
| 5,686,855 A | * | 11/1997 | Lee | 327/378 |
| 5,754,879 A | | 5/1998 | Johnston | |
| 5,969,540 A | * | 10/1999 | Hwang | 326/56 |
| 5,990,704 A | * | 11/1999 | Erickson et al. | 326/56 |
| 6,133,753 A | | 10/2000 | Thomson et al. | |
| 6,134,686 A | | 10/2000 | Jha | |
| 6,237,090 B1 | | 5/2001 | Alavoine | |
| 6,271,675 B1 | | 8/2001 | Sakaki | |
| 6,281,708 B1 | * | 8/2001 | Kenny | 326/86 |
| 6,539,511 B1 | | 3/2003 | Hashizume | |
| 6,640,273 B1 | | 10/2003 | Spisak et al. | |
| 6,774,663 B2 | | 8/2004 | Moreaux et al. | |
| 7,046,562 B2 | | 5/2006 | Roohparvar | |
| 7,098,833 B2 | | 8/2006 | Stulik et al. | |
| 7,259,588 B2 | | 8/2007 | Ahne | |
| 7,366,577 B2 | | 4/2008 | DiSanza et al. | |

(Continued)

FOREIGN PATENT DOCUMENTS

JP 2004-47720 A 2/2004

*Primary Examiner* — Thomas J Hiltunen
(74) *Attorney, Agent, or Firm* — McGinn IP Law Group, PLLC

(57) ABSTRACT

A semiconductor device including an internal terminal, a first transistor of a first conductivity type that is coupled between a first reference potential and the internal terminal, and that includes a first control terminal, a second transistor of a second conductivity type that is coupled between a second reference potential and the internal terminal, and that includes a second control terminal, an oscillator that includes an output terminal to output a clock signal, and a comparator that is coupled to the internal terminal, and that compares a potential of the internal terminal when the internal terminal is coupled to the first reference potential with a potential of the internal terminal when the internal terminal is coupled to the second reference potential. Each control terminals is coupled to the output terminal to commonly receive the clock signal, and the first and second transistors exclusively operate in response to the clock signal.

15 Claims, 7 Drawing Sheets

U.S. PATENT DOCUMENTS

| | | |
|---|---|---|
| 7,418,614 B2 | 8/2008 | Shirotori |
| 7,436,232 B2 | 10/2008 | Sivero et al. |
| 7,698,610 B2 * | 4/2010 | Gomez Arguello ........... 714/724 |
| 7,919,986 B2 | 4/2011 | Swoboda |
| 8,013,630 B2 | 9/2011 | Ito |
| 8,207,761 B2 * | 6/2012 | Kohamada .................... 327/112 |
| 2006/0164177 A1 | 7/2006 | Shirotori |
| 2006/0208247 A1 | 9/2006 | Barlow |
| 2007/0159210 A1 | 7/2007 | Sato |
| 2008/0094918 A1 | 4/2008 | Fujizoe |
| 2009/0243400 A1 | 10/2009 | Fukuda |

* cited by examiner

Fig. 5

| EXTERNAL TERMINAL | INTERNAL TERMINAL | | | OPERATION MODE SWITCH CIRCUIT | |
|---|---|---|---|---|---|
| | BONDING | PULL-UP | PULL-DOWN | RESULT | OPERATION MODE |
| H | YES | H | H | L | MODE 0 |
| H | NO | H | L | H | MODE 1 |
| L | YES | L | L | L | MODE 0 |
| L | NO | H | L | H | MODE 1 |

Fig. 7

| EXTERNAL TERMINAL | INTERNAL TERMINAL-1 | | | OPERATION MODE SWITCH CIRCUIT-1 | | INTERNAL TERMINAL-2 | | | OPERATION MODE SWITCH CIRCUIT-2 | | I/O CIRCUIT | |
|---|---|---|---|---|---|---|---|---|---|---|---|---|
| | BONDING | PULL-UP | PULL-DOWN | RESULT | OPERATION MODE | BONDING | PULL-UP | PULL-DOWN | RESULT | OPERATION MODE | TERMINAL INPUT | RESULT INPUT |
| H | YES | H | H | L | MODE 0 | YES | H | H | L | MODE 0 | H,H | L,L |
| | | | | | | NO | H | L | H | MODE 1 | H,* | L,H |
| | NO | H | L | H | MODE 1 | YES | H | H | L | MODE 0 | *,H | H,L |
| | | | | | | NO | H | L | H | MODE 1 | *,* | H,H |
| L | YES | L | L | L | MODE 0 | YES | L | L | L | MODE 0 | L,L | L,L |
| | | | | | | NO | L | H | H | MODE 1 | L,* | L,H |
| | NO | H | L | H | MODE 1 | YES | L | L | L | MODE 0 | *,L | H,L |
| | | | | | | NO | L | H | H | MODE 1 | *,* | H,H |

*: ALTERNATELY SWITCH BETWEEN "H" AND "L"

SEMICONDUCTOR DEVICE AND OPERATION MODE SWITCH METHOD

INCORPORATION BY REFERENCE

The present application is a Continuation Application of U.S. patent application Ser. No. 12/654,381, filed on Dec. 17, 2009, and now U.S. Pat. No. 8,207,761, and claims priority from Japanese Patent Application No. 2008-324581, filed on Dec. 19, 2008, the entire contents of which is incorporated herein by reference.

BACKGROUND OF THE INVENTION

1. Field of the Invention

The present invention relates to a semiconductor device. In particular, the present invention relates to a semiconductor device whose operation mode is switchable.

2. Description of Related Art

A technique that selectively activates a desired function in a semiconductor device is known. For example, differently specified circuits are beforehand installed in the same semiconductor chip in order to support different specifications of users. The same semiconductor chip can provide individual function required by each user by switching an operation mode.

As a related technique, U.S. Pat. No. 5,754,879 discloses a technique that performs mode switching by using existing specific terminals (pads) such as a VDD terminal (power-supply terminal), a GND terminal (ground terminal) and a RESET terminal (reset terminal). According to the related technique, no special external terminal is necessary. However, it is required to design the three pads to be connectable to the same external terminal. In this case, in order to avoid problems such as intersection of interconnections, it is necessary to collectively place the three pads dedicated to the mode switching. Moreover, the three pads each cannot be used as an input/output pad.

Japanese Laid-Open Patent Application JP-2004-047720 discloses a technique that switches two operation modes by changing wire bonding to a package pin. According to this related technique, one of two pads can be used for the operation mode switching and the other can be used as an input/output pad, by the operation mode switching. According to this related technique, however, a level of an input signal input to the pin is changed when the mode is switched. That is, it is necessary to prepare a special input signal when performing the mode switching.

The inventor of the present application has recognized the following points.

In general, an operation mode switch pad is arranged close to the specific terminals such as the RESET terminal (reset terminal) and the VDD terminal (power-supply terminal). However, it is not possible to arrange a lot of operation mode switch pads near the specific terminals, due to layout restriction. Moreover, the semiconductor device is increasingly miniaturized in recent years. As the miniaturization proceeds, the number of internal circuits that can be arranged increases and thus increase in the number of pads is required. However, a pad size and arrangement-permitted areas are predetermined, due to precision of bonding and the like. Thus, even when the miniaturization of the semiconductor device proceeds, degree of freedom of the pad arrangement is not so improved. Therefore, an operation mode switching technique is important. However, according to the existing operation mode switching technique, it is required to prepare a plurality of dedicated pads or a special external environment in order to switch the operation mode of the semiconductor device.

SUMMARY

In an aspect of the present invention, a semiconductor device has: a pull-up circuit connectable to an internal terminal; a pull-down circuit connectable to the internal terminal; and an operation mode switch circuit configured to switch an operation mode based on a potential of the internal terminal when the pull-up circuit is connected to the internal terminal and a potential of the internal terminal when the pull-down circuit is connected to the internal terminal.

In another aspect of the present invention, a semiconductor device has: an external terminal; and a substrate. The substrate has: an internal terminal connectable to the external terminal; a pull-up circuit connectable to the internal terminal; a pull-down circuit connectable to the internal terminal; and an operation mode switch circuit configured to switch an operation mode based on a potential of the internal terminal when the pull-up circuit is connected to the internal terminal and a potential of the internal terminal when the pull-down circuit is connected to the internal terminal.

In still another aspect of the present invention, an operation mode switch method includes: pulling up an internal terminal of a semiconductor device to monitor a potential of the internal terminal; pulling down the internal terminal to monitor a potential of the internal terminal; and switching an operation mode based on the potential of the internal terminal when the internal terminal is pulled up and the potential of the internal terminal when the internal terminal is pulled down.

According to the present invention, it is not necessary to prepare a plurality of dedicated pads nor to request a special signal, a special signal and the like, in order to switch the operation mode of the semiconductor device. It is possible to switch the operation mode based on connection/disconnection with respect to an external terminal such as a bonding wire.

It is possible to arrange a lot of operation mode switch pads without restricted by specification of product terminals or pad layout design.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 5 is a diagram showing potential states in the semiconductor device in the first embodiment of the present invention;

FIG. 7 is a diagram showing potential states in the semiconductor device in the second embodiment of the present invention.

DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

A first embodiment of the present invention will be described below with reference to the attached drawings.

Figure 1:
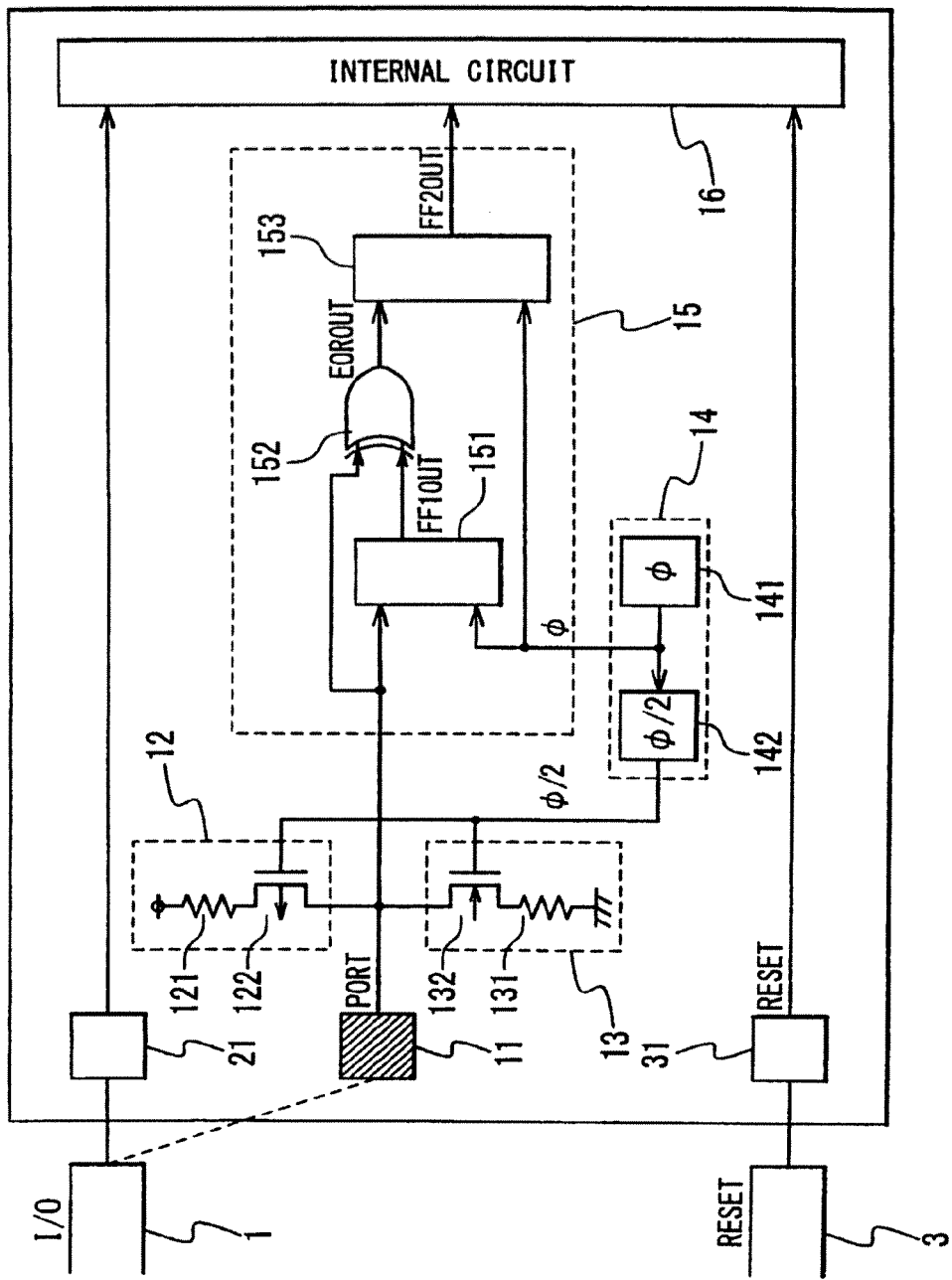
FIG. 1 shows an example of a circuit configuration of a semiconductor device in a first embodiment of the present invention.

As shown in FIG. 1, a semiconductor device of the present embodiment has an internal terminal 11, a pull-up circuit 12, a pull-down circuit 13, a clock generation circuit 14, an operation mode switch circuit 15 and an internal circuit.

The semiconductor device of the present embodiment is exemplified by a semiconductor chip (bare chip), a semiconductor package, a print circuit board, an electronic device, a computer, a cell phone, an automobile and the like. Typically, the internal terminal 11, the pull-up circuit 12, the pull-down circuit 13, the clock generation circuit 14, the operation mode switch circuit 15 and the internal circuit 16 are mounted on a substrate. The substrate is connected to an external terminal. A method for connecting between an electrode of the substrate and the external terminal includes wire bonding, TAB (Tape Automated Bonding), flip chip and the like.

The internal terminal 11 is an electrode of the substrate that is connectable to a first external terminal 1. In the present embodiment, the internal terminal 11 is an operation mode switch pad (operation mode switch terminal). The first external terminal 1 is connected to the substrate including the internal terminal 11. An external signal can be input to the substrate through the first external terminal 1, and a processing result can be output from the substrate through the first external terminal 1. The first external terminal 1 is exemplified by a package pin, a lead frame, a solder ball (bump) and the like.

The pull-up circuit 12 is connected to the internal terminal 11. The pull-up circuit 12 is a circuit for pulling up a potential of the internal terminal 11 to a power-supply potential. The pull-up circuit 12 supplies (applies) the power-supply potential to the internal terminal 11.

The pull-up circuit 12 includes a pull-up resistor 121 and a switch 122.

One end of the pull-up resistor 121 is connected to the power-supply, and a potential of a circuit connected to the other end of the pull-up resistor 121 is pulled up. When the internal terminal 11 is in an OPEN state, the pull-up resistor 121 makes the potential of the internal terminal 11 "High" level.

The switch 122 is ON/OFF controlled in accordance with a clock signal "φ/2". The switch 122 includes a MOSFET (Metal Oxide Semiconductor Field Effect Transistor).

The pull-down circuit 13 is connected to the internal terminal 11. The pull-down circuit 13 is a circuit for pulling down the potential of the internal terminal 11 to a ground potential. The pull-down circuit 13 supplies (applies) the ground potential to the internal terminal 11.

The pull-down circuit 13 includes a pull-down resistor 131 and a switch 132.

One end of the pull-down resistor 131 is connected to the ground, and a potential of a circuit connected to the other end of the pull-down resistor 131 is pulled down. When the internal terminal 11 is in the OPEN state, the pull-down resistor 131 makes the potential of the internal terminal 11 "Low" level.

The switch 132 is ON/OFF controlled in accordance with the clock signal "φ/2". The switch 132 includes a MOSFET.

Here, the switch 122 and the switch 132 are "complementarily" turned ON/OFF in accordance with the clock signal "φ/2". That is, when one of the switch 122 and the switch 132 is turned ON, the other is turned OFF. For example, the switch 122 is a pMOS (p-channel MOS) transistor and the switch 132 is a nMOS (n-channel MOS) transistor. In this manner, the switch 122 and the switch 132 respectively and alternately activate the pull-up circuit 12 and the pull-down circuit 13 in accordance with the clock signal "φ/2". It should be noted that the switch 122 and the switch 132 can be collectively regarded as one switch circuit. The switch circuit includes the switch 122 and the switch 132. Here, the switch 122 and the switch 132 are collectively called a "switch".

The clock generation circuit 14 outputs clock signals to the pull-up circuit 12, the pull-down circuit 13 and the operation mode switch circuit 15 as appropriate.

The clock generation circuit 14 includes an oscillation circuit 141 and a frequency dividing circuit 142.

The oscillation circuit 141 generates a clock signal "φ". The oscillation circuit 141 outputs the clock signal "φ" to the operation mode switch circuit 15. The oscillation circuit 141 may be a circuit outputting the clock signal based on an internal clock or a circuit outputting the clock signal that is externally input through a clock input terminal. That is, the oscillation circuit 141 just needs to output the clock signal "φ".

The frequency dividing circuit 142 frequency-divides the clock signal "φ" to generate the clock signal "φ/2". The frequency dividing circuit 142 outputs the clock signal "φ/2" to the switch 122 and the switch 132. The frequency dividing circuit 142 may be an oscillation circuit generating the clock signal "φ/2". In this case, the frequency dividing circuit 142 preferably generates the clock signal "φ/2" in accordance with the clock signal "φ". The frequency dividing circuit 142 may be a circuit outputting the clock signal "φ/2" that is externally input through a clock input terminal. That is, the frequency dividing circuit 142 just needs to output the clock signal "φ/2".

The operation mode switch circuit 15 switches the operation mode based on the potential of the internal terminal 11 when the internal terminal 11 is pulled up and the potential of the internal terminal 11 when the internal terminal 11 is pulled down.

The operation mode switch circuit 15 includes a memory circuit 151, a selection circuit 152 and a memory circuit 153.

The memory circuit 151 is for retaining the potential of the internal terminal 11. A signal indicating a current potential of the internal terminal 11 is input to one input of the memory circuit 151, and the clock signal "φ" is input to the other input thereof. The memory circuit 151 retains the signal indicating the potential of the internal terminal 11 and outputs the retained signal in accordance with the clock signal "φ".

The selection circuit 152 detects whether or not the internal terminal 11 is connected to the first external terminal 1, based on the potential of the internal terminal 11 when the pull-up circuit 12 is connected to the internal terminal 11 and the potential of the internal terminal 11 when the pull-down circuit 13 is connected to the internal terminal 11. Here, a signal indicating a current potential of the internal terminal 11 is input to one input of the selection circuit 152, and an output signal of the memory circuit 151 is input to the other input of thereof.

The memory circuit 153 is for retaining a result of the detection by the selection circuit 152. Here, an output signal of the selection circuit 152 is input to one input of the memory circuit 153, and the clock signal "φ" is input to the other input thereof as in the case of the memory circuit 151. The memory circuit 153 retains the output signal of the selection circuit 152 and outputs the retained signal in accordance with the clock signal "φ".

The memory circuit 151 and the memory circuit 153 each is exemplified by a flip-flop circuit, a latch circuit and the like. The memory circuit 151 and the memory circuit 153 just need to retain data. In the present embodiment, the memory circuit 151 and the memory circuit 153 each is a flip-flop circuit.

The selection circuit 152 is exemplified by a two-input logic gate such as an exclusive OR circuit (EXOR circuit), an operational amplifier, a comparator and the like. The selection circuit 152 just needs to generate one output signal based on two input signals. In the present embodiment, the selection circuit 152 is an EXOR circuit.

The internal circuit 16 determines the operation mode depending on the output signal of the operation mode switch circuit 15 and operates in accordance with the operation mode. That is, the operation mode switch circuit 15 switches the operation mode of the internal circuit 16. The internal circuit 16 functions as a circuit for determining the operation mode.

The internal circuit 16 is further connected with an input terminal 21 and a reset terminal 31. The input terminal 21 is connected to the first external terminal 1. The input terminal 21 and the reset terminal 31 each is exemplified by an I/O (Input/Output) pad and the like. The first external terminal 1 is an external I/O terminal (input/output terminal). The input terminal 21 is a normal I/O pad. The reset terminal 31 is connected to a second external terminal 3. The second external terminal 3 is an external RESET terminal. The reset terminal 31 receives a reset signal.

The internal circuit 16 determines the operation mode during a RESET period when the input/output signal is not changed generally. The internal circuit 16 receives an external input signal from the first external terminal 1 through the input terminal 21. The internal circuit 16 operates depending on the received external input signal and the determined operation mode.

<Operation Mode Determination Timing (OPEN Terminal)>

An operation mode determination timing in a case of an OPEN state where the external terminal 1 and the internal terminal 11 are disconnected from each other will be described below with reference to FIG. 2.

Figure 2:
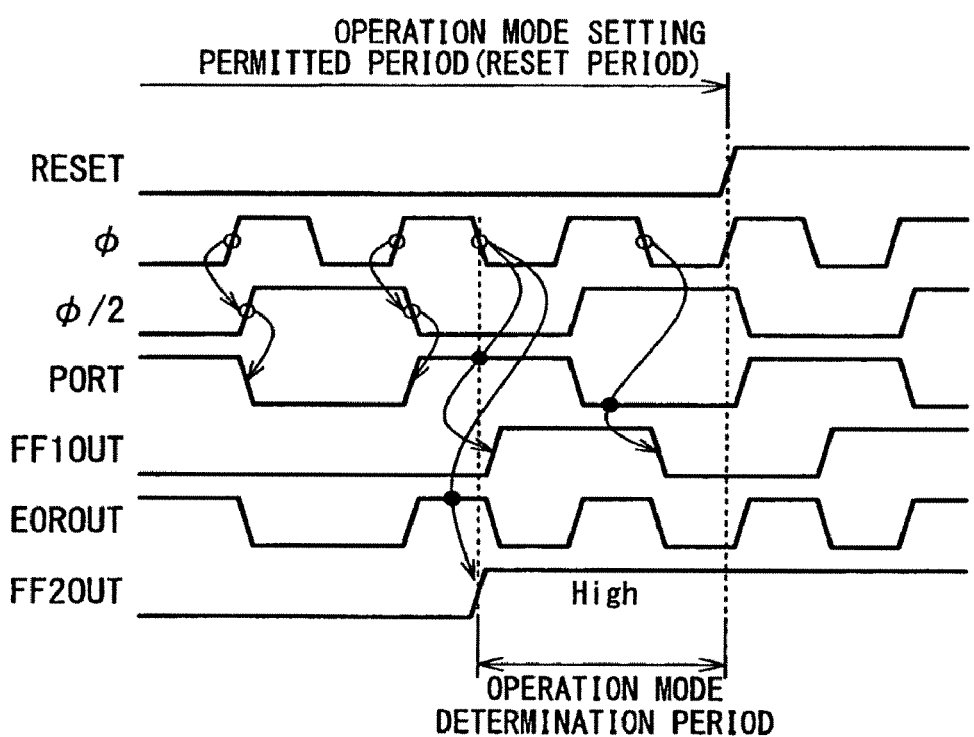
FIG. 2 is a timing chart showing an operation mode determination timing (OPEN terminal)

Shown in FIG. 2 are the reset signal "RESET", the clock signal "φ", the clock signal "φ/2", a PORT signal "PORT", a FF1 output signal "FF1OUT", a EOR output signal "EOROUT" and a FF2 output signal "FF2OUT".

The reset signal "RESET" is a signal for setting all the internal circuit to an initial state. Here, the reset signal "RESET" is "RESETB" that changes from "Low" to "High". In a RESET period, the reset signal "RESET" is not changed and the same logic level is supplied. As shown in FIG. 2, a period during which a potential of the reset signal "RESET" is "Low" level is the RESET period. In the present embodiment, the mode setting is enabled only in the RESET period, in order to avoid a false operation due to an accidental change in the I/O data. Therefore, the RESET period corresponds to an operation mode setting permitted period in the present embodiment.

The clock signal "φ" is a signal repeating "High"-"Low" with a predetermined period. When the clock signal "φ" is supplied to the memory circuit, another data signal supplied to the memory circuit can be delayed in accordance with the above-mentioned period. In the present embodiment, the clock signal "φ" is supplied to the memory circuit 151 and the memory circuit 153.

The clock signal "φ/2" is a signal whose period is twice the period of the clock signal "φ". The clock signal "φ/2" rises up along with the first rising of the clock signal "φ", falls down along with the second rising of the clock signal "φ" and rises up again along with the third rising of the clock signal "φ". The clock signal "φ/2" is for ON/OFF controlling the switch 122 and the switch 132. Therefore, activation/deactivation of the pull-up circuit 12 and the pull-down circuit 13 is determined depending on the potential of the clock signal "φ/2".

The PORT signal "PORT" is a signal indicating the potential of the internal terminal 11. The PORT signal "PORT" is supplied to the memory circuit 151 and the selection circuit 152. In the present embodiment, the PORT signal "PORT" is an inversed signal of the clock signal "φ/2". The reason is as follows. In the case of the OPEN state, the internal terminal 11 is not connected to the first external terminal 1. Therefore, when the potential of the clock signal "φ/2" is "Low" level, the switch 122 is turned ON, the pull-up circuit 12 is activated, the switch 132 is turned OFF, the pull-down circuit 13 is deactivated, and thus the potential of the PORT signal "PORT" becomes "High" level. On the other hand, when the potential of the clock signal "φ/2" is "High" level, the switch 122 is turned OFF, the pull-up circuit 12 is deactivated, the switch 132 is turned ON, the pull-down circuit 13 is activated, and thus the potential of the PORT signal "PORT" becomes "Low" level.

The FF1 output signal "FF1OUT" indicates the output signal of the memory circuit 151. The FF1 output signal "FF1OUT" rises up, if the potential of the PORT signal "PORT" is "High" level at the time when the clock signal "φ" falls down. Also, the FF1 output signal "FF1OUT" falls down, if the potential of the PORT signal "PORT" is "Low" level at the time when the clock signal "φ" falls down.

The EOR output signal "EOROUT" indicates the output signal of the selection circuit 152. A potential of the EOR output signal "EOROUT" is calculated by exclusive OR operation of the potential of the FF1 output signal "FF1OUT" and the potential of the PORT signal "PORT". In other words, the potential of the EOR output signal "EOROUT" becomes "High" level when the potential of one of the FF1 output signal "FF1OUT" and the PORT signal "PORT" is "High" level and the other potential is "Low" level. Also, the potential of the EOR output signal "EOROUT" becomes "Low" level when the potentials of both of the FF1 output signal "FF1OUT" and the PORT signal "PORT" are "High" level or "Low" level.

The FF2 output signal "FF2OUT" indicates the output signal of the memory circuit 153. The FF2 output signal "FF2OUT" rises up, if the potential of the EOR output signal "EOROUT" is "High" level at the time when the clock signal "φ" falls down. In the present case, a period from the second falling down of the clock signal "φ" to an end of the operation mode setting permitted period is an operation mode determination period.

<Operation Mode Determination Timing (Bonding terminal=H)>

An operation mode determination timing in a case where the external terminal 1 and the internal terminal 11 are connected with each other and the potential of the PORT signal from a bonding terminal is "High" level will be described below with reference to FIG. 3. As an example, the internal terminal 11 is bonding-connected to the VDD terminal (power-supply terminal).

Figure 3:
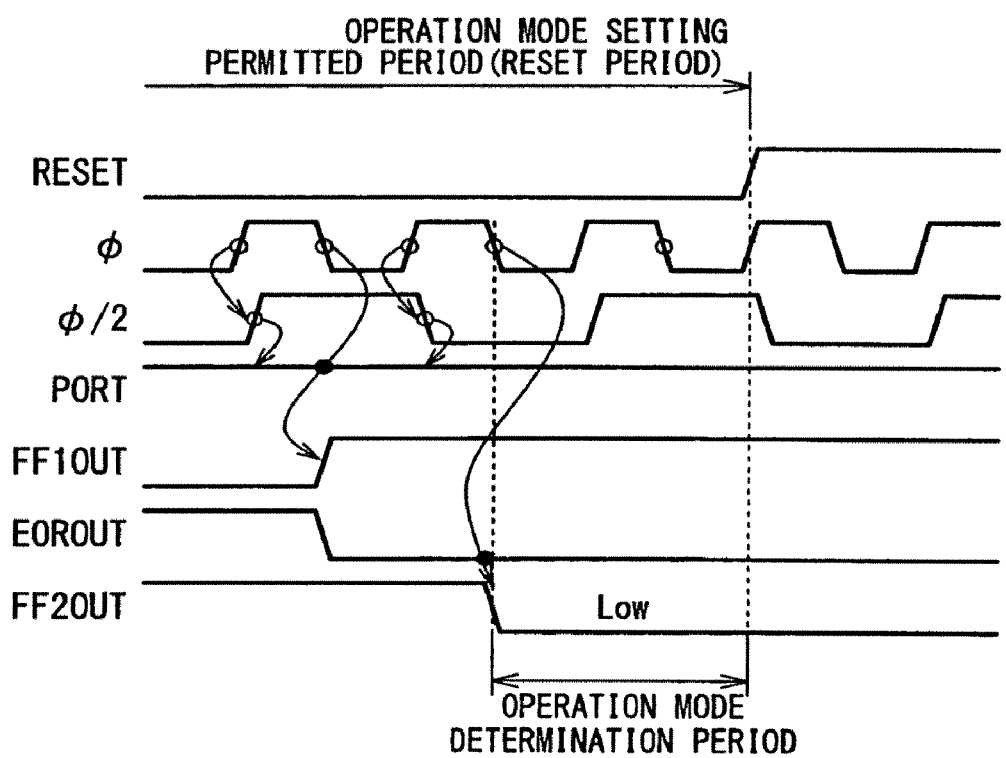
FIG. 3 is a timing chart showing an operation mode determination timing (bonding terminal=H)

The signals shown in FIG. 3 are the same as in the case of FIG. 2. Operations of the reset signal "RESET", the clock signal "φ" and the clock signal "φ/2" are the same as in the case of FIG. 2.

In the present case, the potential of the PORT signal is "High" level. The potential of the PORT signal "PORT" is "High" level.

Since the potential of the PORT signal "PORT" is "High" level at the time when the clock signal "φ" firstly falls down, the FF1 output signal "FF1OUT" rises up. Then, the potential of the FF1 output signal "FF1OUT" is maintained at the "High" level, because the potential of the PORT signal "PORT" is always "High" level.

Since the potential of the PORT signal "PORT" is "High" level, the potential of the EOR output signal "EOROUT" is "High" level during a period when the potential of the FF1 output signal "FF1OUT" is "Low" level. When the potential of the FF1 output signal "FF1OUT" changes to "High" level, the both potentials of the FF1 output signal "FF1OUT" and the PORT signal "PORT" are "High" level, and thus the potential of the EOR output signal "EOROUT" becomes "Low" level.

The FF2 output signal "FF2OUT" falls down, if the potential of the EOR output signal "EOROUT" is "Low" level at the time when the clock signal "φ" falls down. In the present case, a period from the second falling down of the clock signal "φ" to an end of the operation mode setting permitted period is an operation mode determination period.

<Operation Mode Determination Timing (Bonding Terminal=L)>

An operation mode determination timing in a case where the external terminal 1 and the internal terminal 11 are connected with each other and the potential of the PORT signal from a bonding terminal is "Low" level will be described below with reference to FIG. 4. As an example, the internal terminal 11 is bonding-connected to the GND terminal (ground terminal).

Figure 4:
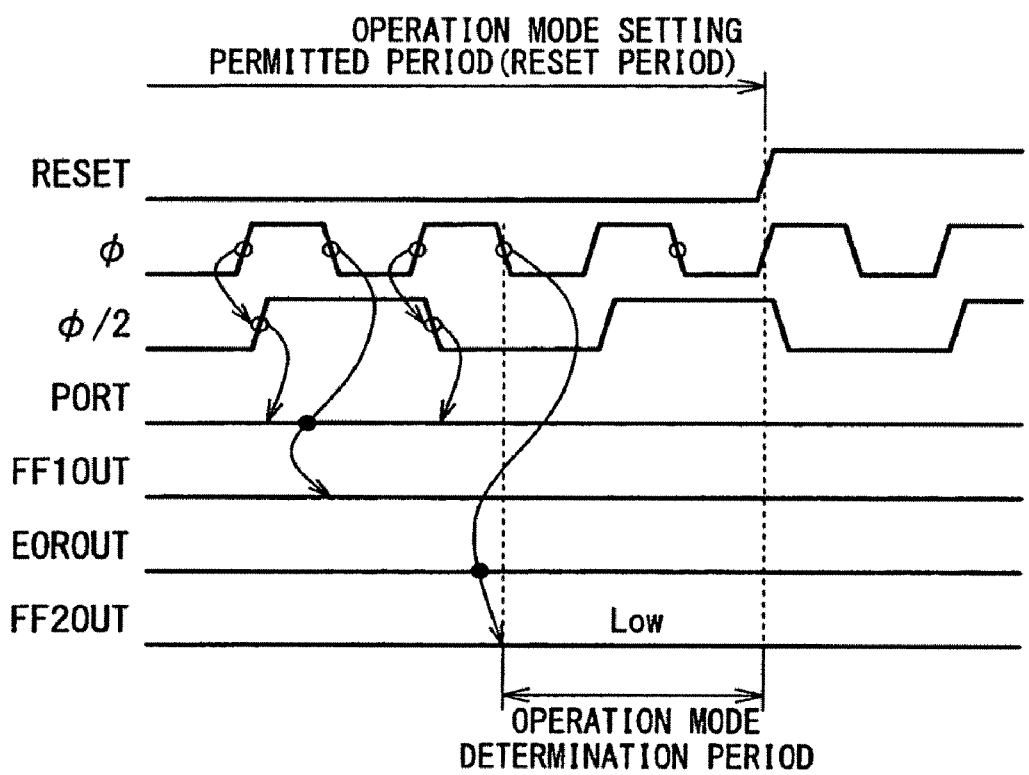
FIG. 4 is a timing chart showing an operation mode determination timing (bonding terminal=L)

The signals shown in FIG. 4 are the same as in the case of FIG. 2. Operations of the reset signal "RESET", the clock signal "φ" and the clock signal "φ/2" are the same as in the case of FIG. 2.

In the present case, the potential of the PORT signal is "Low" level. The potential of the PORT signal "PORT" is "Low" level.

Since the potential of the PORT signal "PORT" is always "Low" level at the time when the clock signal "φ" falls down, the potential of the FF1 output signal "FF1OUT" is maintained at the "Low" level.

Since the both potentials of the PORT signal "PORT" and the FF1 output signal "FF1OUT" are always "Low" level, the potential of the EOR output signal "EOROUT" is "Low" level.

Since the potential of the EOR output signal "EOROUT" is always "Low" level at the time when the clock signal "φ" falls down, the potential of the FF2 output signal "FF2OUT" is maintained at the "Low" level. In the present case, a period from the second falling down of the clock signal "φ" to an end of the operation mode setting permitted period is an operation mode determination period. The operation mode determination period in FIG. 4 corresponds to the operation mode determination period shown in FIG. 2 or FIG. 3.

The potential states in the semiconductor device according to the present embodiment will be described below with reference to FIG. 5. A table shown in FIG. 5 indicates "external terminal", "internal terminal" and "operation mode switch circuit". The "external terminal" indicates the first external terminal 1. The "internal terminal" indicates the internal terminal 11. The "operation mode switch circuit" indicates the operation mode switch circuit 15. In a case where the potential of the output signal of the operation mode switch circuit 15 is "Low" level, the internal circuit 16 determines the operation mode as a "mode 0". In a case where the potential of the output signal of the operation mode switch circuit 15 is "High" level, the internal circuit 16 determines the operation mode as a "mode 1".

First, cases where the potential of the first external terminal 1 is "High" level will be explained.

In the case where the first external terminal 1 is bonding-connected to the internal terminal 11 (in the case of bonding: Yes), the potential of the internal terminal 11 is "High" level regardless of the pull-up circuit 12 and the pull-down circuit 13. In this case, the potential of the input signal to the operation mode switch circuit 15 is always "High" level, and thus potentials of the two input signals to the selection circuit 152 both are "High" level. In the present embodiment, the selection circuit 152 is the EXOR circuit, and the potential of the output signal of the operation mode switch circuit 15 is "Low" level. Since the potential of the output signal of the operation mode switch circuit 15 is "Low" level, the internal circuit 16 determines the operation mode as the "mode 0".

In the case where the first external terminal 1 is not bonding-connected to the internal terminal 11 (in the case of bonding: No), the potential of the internal terminal 11 becomes "High" level when the internal terminal 11 is connected to the pull-up circuit 12 and becomes "Low" level when the internal terminal 11 is connected to the pull-down circuit 13. In this case, the potential of the input signal to the operation mode switch circuit 15 is switched in accordance with the clock signal "φ/2". The potential before the switching is retained by the memory circuit 151. Therefore, the potential of one of the two input signals to the selection circuit 152 is "High" level, and the other potential is "Low" level. In the present embodiment, the selection circuit 152 is the EXOR circuit, and the potential of the output signal of the operation mode switch circuit 15 is "High" level. Since the potential of the output signal of the operation mode switch circuit 15 is "High" level, the internal circuit 16 determines the operation mode as the "mode 1".

Next, cases where the potential of the first external terminal 1 is "Low" level will be explained.

In the case where the first external terminal 1 is bonding-connected to the internal terminal 11 (in the case of bonding: Yes), the potential of the internal terminal 11 is "Low" level regardless of the pull-up circuit 12 and the pull-down circuit 13. In this case, the potential of the input signal to the operation mode switch circuit 15 is always "Low" level, and thus potentials of the two input signals to the selection circuit 152 both are "Low" level. In the present embodiment, the selection circuit 152 is the EXOR circuit, and the potential of the output signal of the operation mode switch circuit 15 is "Low" level. Since the potential of the output signal of the operation mode switch circuit 15 is "Low" level, the internal circuit 16 determines the operation mode as the "mode 0".

In the case where the first external terminal 1 is not bonding-connected to the internal terminal 11 (in the case of bonding: No), the potential of the internal terminal 11 becomes "High" level when the internal terminal 11 is connected to the pull-up circuit 12 and becomes "Low" level when the internal terminal 11 is connected to the pull-down circuit 13. In this case, the potential of the input signal to the operation mode switch circuit 15 is switched in accordance with the clock signal "φ/2". The potential before the switching is retained by the memory circuit 151. Therefore, the potential of one of the two input signals to the selection circuit 152 is "High" level, and the other potential is "Low" level. In the present embodiment, the selection circuit 152 is the EXOR circuit, and the potential of the output signal of the operation mode switch circuit 15 is "High" level. Since the potential of the output signal of the operation mode switch circuit 15 is "High" level, the internal circuit 16 determines the operation mode as the "mode 1".

Next, a second embodiment of the present invention will be described below with reference to the attached drawings.

Figure 6:
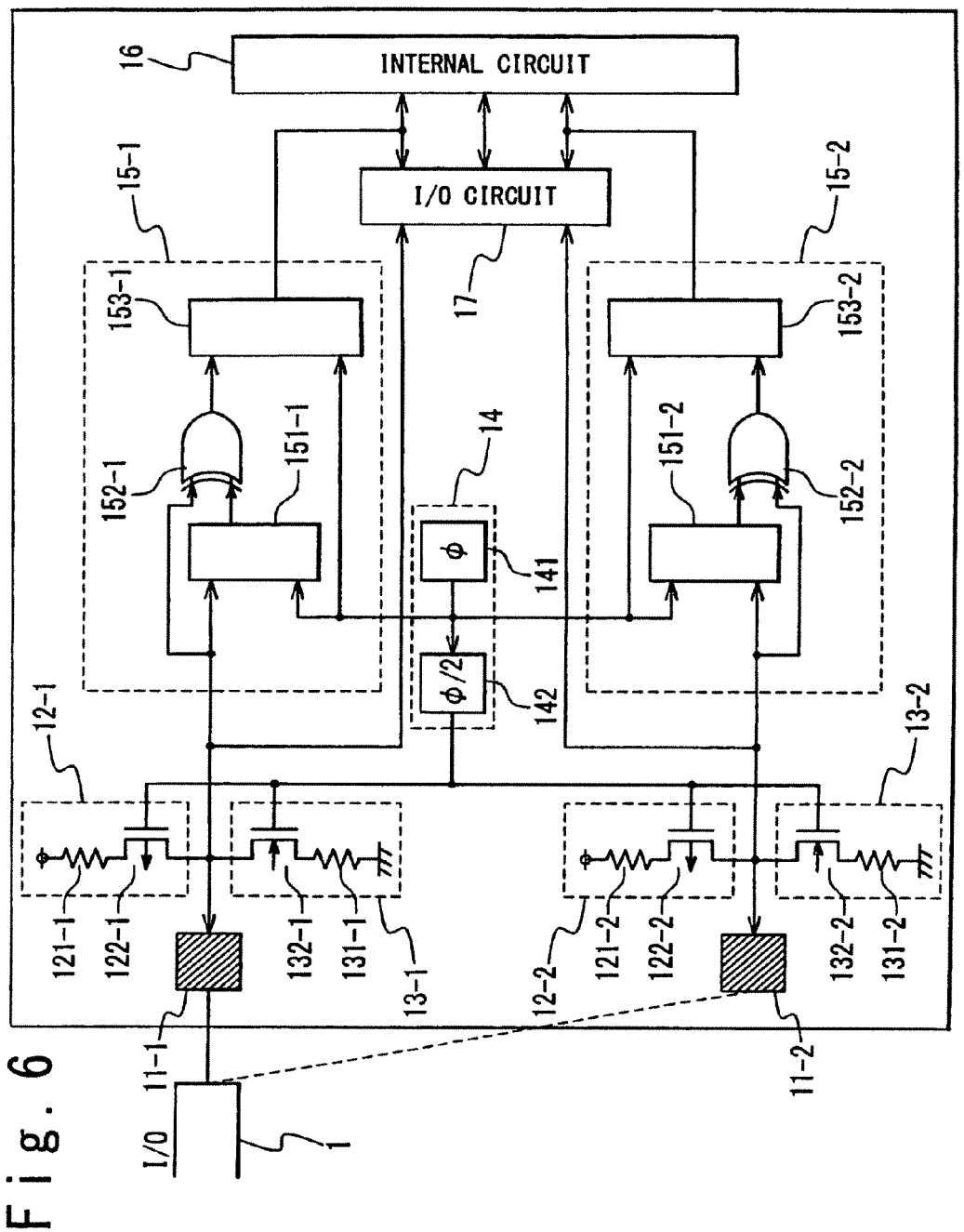
FIG. 6 shows an example of a circuit configuration of a semiconductor device in a second embodiment of the present invention.

In the present embodiment, as shown in FIG. 6, the circuit configuration shown in FIG. 1 is extended and the semiconductor device supports a plurality of internal terminals. For simplicity, a case where two internal terminals are used will be described as an example. A case where three or more internal terminals are used is basically the same.

As shown in FIG. 6, the semiconductor device according to the present embodiment has internal terminals 11 (11-$x$, $x$=1 to n: n is the number of internal terminals), pull-up circuits 12 (12-$x$, $x$=1 to n), pull-down circuits 13 (13-$x$, $x$=1 to n), a clock generation circuit 14, operation mode switch circuits 15 (15-$x$, $x$=1 to n), an internal circuit 16 and an input/output circuit 17.

The internal terminal 11 (11-$x$, $x$=1 to n), the pull-up circuit 12 (12-$x$, $x$=1 to n), the pull-down circuit 13 (13-$x$, $x$=1 to n) and the operation mode switch circuit 15 (15-$x$, $x$=1 to n) are provided for each internal terminal 11.

The clock generation circuit 14, the internal circuit 16 and the input/output circuit 17 are shared in the semiconductor device. That is, at least one set of the clock generation circuit 14, the internal circuit 16 and the input/output circuit 17 just needs to be provided in the semiconductor device. Of course, the clock generation circuit 14 may be provided with respect to each internal terminal 11.

In the present embodiment, the internal terminal 11 (11-$x$, $x$=1 to n) is a combined pad of the operation mode switch pad and the I/O pad. In other words, the internal terminal 11 (11-$x$, $x$=1 to n) serves as not only the operation mode switch pad as in the case of the first embodiment but also the I/O pad.

The pull-up circuit 12 (12-$x$, $x$=1 to n), the pull-down circuit 13 (13-$x$, $x$=1 to n), the clock generation circuit 14, the operation mode switch circuit 15 (15-$x$, $x$=1 to n) and the internal circuit 16 are basically the same as the pull-up circuit 12, the pull-down circuit 13, the clock generation circuit 14, the operation mode switch circuit 15 and the internal circuit 16 shown in FIG. 1, respectively.

The input/output circuit 17 is connected to the internal terminal 11 (11-$x$, $x$=1 to n), the operation mode switch circuit 15 (15-$x$, $x$=1 to n) and the internal circuit 16. Depending on the output signals of the operation mode switch circuits 15 (15-$x$, $x$=1 to n), the input/output circuit 17 selects input/output signals of the internal terminals 11 (11-$x$, $x$=1 to n) and an input/output signal of the internal circuit 16, and outputs them to the respective destination. In other words, the input/output circuit 17 selects the input signal and the output signal between the internal terminal 11 (11-$x$, $x$=1 to n) and the internal circuit 16 depending on the operation mode, and outputs them to the internal terminal 11 (11-$x$, $x$=1 to n) and the internal circuit 16.

The potential states in the semiconductor device according to the present embodiment will be described below with reference to FIG. 7. A table shown in FIG. 7 indicates "external terminal", "internal terminal-1", "operation mode switch circuit-1", "internal terminal-2", "operation mode switch circuit-2" and "input/output circuit". The "external terminal" indicates the first external terminal 1. The "internal terminal-1" indicates the internal terminal 11-1. The "operation mode switch circuit-1" indicates the operation mode switch circuit 15-1. The "internal terminal-2" indicates the internal terminal 11-2. The "operation mode switch circuit-2" indicates the operation mode switch circuit 15-2. The "input/output circuit" indicates the input/output circuit 17. In a case where the potential of the output signal of the operation mode switch circuit 15-1 is "Low" level, the internal circuit 16 determines the operation mode on the side of the internal terminal 11-1 as the "mode 0". In a case where the potential of the output signal of the operation mode switch circuit 15-1 is "High" level, the internal circuit 16 determines the operation mode on the side of the internal terminal 11-1 as the "mode 1". In a case where the potential of the output signal of the operation mode switch circuit 15-2 is "Low" level, the internal circuit 16 determines the operation mode on the side of the internal terminal 11-2 as the "mode 0". In a case where the potential of the output signal of the operation mode switch circuit 15-2 is "High" level, the internal circuit 16 determines the operation mode on the side of the internal terminal 11-2 as the "mode 1". Moreover, the internal circuit 16 may determine the operation mode of the semiconductor device as a whole, based on the potentials of the output signals of both the operation mode switch circuit 15-1 and the operation mode switch circuit 15-2.

The potential states of the "external terminal", the "internal terminal-1" and the "operation mode switch circuit-1" shown in FIG. 7 are the same as the potential states of the "external terminal", the "internal terminal" and the "operation mode switch circuit" shown in FIG. 5. Similarly, the potential states of the "external terminal", the "internal terminal-2" and the "operation mode switch circuit-2" shown in FIG. 7 are the same as the potential states of the "external terminal", the "internal terminal" and the "operation mode switch circuit" shown in FIG. 5.

The input/output circuit 17 is connected to the internal terminal 11-1 and the internal terminal 11-2. Therefore, the potential is the same between the input/output circuit 17 and the internal terminal 11-1. Similarly, the potential is the same between the input/output circuit 17 and the internal terminal 11-2. Moreover, the input/output circuit 17 receives the output signal of the operation mode switch circuit 15-1 and the output signal of the operation mode switch circuit 15-2.

First, cases where the potential of the first external terminal 1 is "High" level will be explained.

In the case where the first external terminal 1 is bonding-connected to both of the internal terminal 11-1 and the internal terminal 11-2 (in the case of bonding: Yes for both the internal terminals 1 and 2), both of the potential between the input/output circuit 17 and the internal terminal 11-1 and the potential between the input/output circuit 17 and the internal terminal 11-2 are "High" level.

In the case where the first external terminal 1 is bonding-connected to the internal terminal 11-1 and is not bonding-connected to the internal terminal 11-2 (in the case of bonding: Yes for the internal terminal-1 and bonding: No for the internal terminal-2), the potential between the input/output circuit 17 and the internal terminal 11-1 is "High" level, and the potential between the input/output circuit 17 and the internal terminal 11-2 alternately switches between "High" level and "Low" level due to pulling-up and pulling-down.

In the case where the first external terminal 1 is not bonding-connected to the internal terminal 11-1 and is bonding-connected to the internal terminal 11-2 (in the case of bonding: No for the internal terminal-1 and bonding: Yes for the internal terminal-2), the potential between the input/output circuit 17 and the internal terminal 11-1 alternately switches between "High" level and "Low" level due to pulling-up and pulling-down, and the potential between the input/output circuit 17 and the internal terminal 11-2 is "High" level.

In the case where the first external terminal 1 is bonding-connected to neither the internal terminal 11-1 nor the internal terminal 11-2 (in the case of bonding: No for both the internal terminals 1 and 2), both of the potential between the input/output circuit 17 and the internal terminal 11-1 and the potential between the input/output circuit 17 and the internal terminal 11-2 alternately switch between "High" level and "Low" level due to pulling-up and pulling-down.

Next, cases where the potential of the first external terminal 1 is "Low" level will be explained.

In the case where the first external terminal 1 is bonding-connected to both of the internal terminal 11-1 and the internal terminal 11-2 (in the case of bonding: Yes for both the internal terminals 1 and 2), both of the potential between the input/output circuit 17 and the internal terminal 11-1 and the potential between the input/output circuit 17 and the internal terminal 11-2 are "Low" level.

In the case where the first external terminal 1 is bonding-connected to the internal terminal 11-1 and is not bonding-connected to the internal terminal 11-2 (in the case of bonding: Yes for the internal terminal-1 and bonding: No for the internal terminal-2), the potential between the input/output circuit 17 and the internal terminal 11-1 is "Low" level, and the potential between the input/output circuit 17 and the internal terminal 11-2 alternately switches between "High" level and "Low" level due to pulling-up and pulling-down.

In the case where the first external terminal 1 is not bonding-connected to the internal terminal 11-1 and is bonding-connected to the internal terminal 11-2 (in the case of bonding: No for the internal terminal-1 and bonding: Yes for the internal terminal-2), the potential between the input/output circuit 17 and the internal terminal 11-1 alternately switches between "High" level and "Low" level due to pulling-up and pulling-down, and the potential between the input/output circuit 17 and the internal terminal 11-2 is "Low" level.

In the case where the first external terminal 1 is bonding-connected to neither the internal terminal 11-1 nor the internal terminal 11-2 (in the case of bonding: No for both the internal terminals 1 and 2), both of the potential between the input/output circuit 17 and the internal terminal 11-1 and the potential between the input/output circuit 17 and the internal terminal 11-2 alternately switch between "High" level and "Low" level due to pulling-up and pulling-down.

Next, an example of relationship between the input/output circuit 17 and the operation mode will be described below.

For example, when the potential of the output signal of the operation mode switch circuit 15-1 is "Low" level (the operation mode is "mode 0"), it means that the internal terminal 11-1 and the first external terminal 1 are bonding-connected to each other. In this case, the input/output circuit 17 functions as an input circuit for receiving an input signal from the internal terminal 11-1 or an output circuit for generating an output signal to the internal terminal 11-1. Also, when the potential of the output signal of the operation mode switch circuit 15-1 is "High" level (the operation mode is "mode 1"), it means that the internal terminal 11-1 and the first external terminal 1 are disconnected from each other. In this case, the input/output circuit 17 ignores an input signal from the internal terminal 11-1 (the potential of the internal terminal 11-1) and does not generate an output signal with respect to the internal terminal 11-1.

Similarly, when the potential of the output signal of the operation mode switch circuit 15-2 is "Low" level (the operation mode is "mode 0"), it means that the internal terminal 11-2 and the first external terminal 1 are bonding-connected to each other. In this case, the input/output circuit 17 functions as an input circuit for receiving an input signal from the internal terminal 11-2 or an output circuit for generating an output signal to the internal terminal 11-2. Also, when the potential of the output signal of the operation mode switch circuit 15-2 is "High" level (the operation mode is "mode 1"), it means that the internal terminal 11-2 and the first external terminal 1 are disconnected from each other. In this case, the input/output circuit 17 ignores an input signal from the internal terminal 11-2 (the potential of the internal terminal 11-2) and does not generate an output signal with respect to the internal terminal 11-2.

Regarding the internal circuit 16, a large number of operation modes can be set with a small number of pads. In the case of the above-described example, combination of the potentials of the output signals of the respective operation mode switch circuit 15-1 and operation mode switch circuit 15-2 results in three patterns of operation mode: (1) both are "Low" level (both are the "mode 0"); (2) one is "Low" level and the other is "High" level (one is the "mode 0" and the other is the "mode 1"); and (3) both are "High" level (both are the "mode 1"). Based on these three patterns, the internal circuit 16 can prepare three operation modes. That is, the internal circuit 16 can prepare three operation modes depending on the potentials of the two signals, and switch the operation mode among the three operation modes depending on the potentials of the output signals of the operation mode switch circuit 15-1 and the operation mode switch circuit 15-2. Note that the potentials of the output signals of the operation mode switch circuit 15-1 and the operation mode switch circuit 15-2 depend on the potentials of the internal terminal 11-1 and the internal terminal 11-2, respectively. That is to say, according to the present embodiment, it is possible to switch between the three operation modes by using only two pads. The number of operation modes can be designed to be larger than the number of operation mode switch pads.

According to the present embodiment, it is possible to use an arbitrary internal terminal 11 (11-$x$, x=1 to n) as the operation mode switch pad and as a normal I/O pad depending on connection/disconnection with respect to the external terminal. According to the present embodiment, when the semiconductor device is used, it is possible to use an arbitrary pad as a combined pad of the normal I/O pad and the operation mode switch pad, without preparing a special terminal and requesting a special signal for the operation mode switching. The internal terminal 11 (11-$x$, x=1 to n) serves as the input terminal 21 shown in FIG. 1 when connected to the first external terminal 1 (I/O terminal) and serves as the reset terminal 31 shown in FIG. 1 when connected to the second external terminal 3 (RESET terminal).

According to the present invention, as described above, the operation mode can be determined based only on connection/disconnection with respect to the pad 11, regardless of the potential of the package pin.

More specifically, the switches of the pull-up circuit 12 and the pull-down circuit 13 connected to the pad 11 are complementarily ON/OFF controlled, and exclusive OR operation is performed by using the pad potential when the pull-up circuit 12 is connected and the pad potential when the pull-down circuit 13 is connected. The respective potentials are measured in time series. Therefore, the potential measured in front is temporality stored in a memory circuit, and then the exclusive OR operation is performed with respect to the stored potential and the potential measured next. As a result of the operation, the terminal in which the package pin and the pad are connected with each other generates data "0", while the OPEN terminal generates data "1". Therefore, the operation mode can be switched based on these data.

The semiconductor device according to the present invention has: a pull-up circuit connected to a first pad through a switch; a pull-down circuit connected to the same first pad through another switch; a circuit configured to retain a potential of the first pad; a circuit configured to compare a potential of the first pad when the pull-up circuit is connected to the first pad and a potential of the first pad when the pull-down circuit is connected to the first pad; another pull-up circuit connected to a second pad through a switch; another pull-down circuit connected to the same second pad through another switch; a circuit configured to retain a potential of the second pad; and a circuit configured to compare a potential of the second pad when the pull-up circuit is connected to the second pad and a potential of the second pad when the pull-down circuit is connected to the second pad.

The semiconductor device according to the present invention complementarily (alternately) switches the pull-up circuit and the pull-down circuit, compares the pad potential when the pull-up circuit is connected and the pad potential when the pull-down circuit is connected, and thereby detects the connection/disconnection between the pad and the package pin.

Moreover, the semiconductor device according to the present invention switches the operation mode by using the detected signal.

In the semiconductor device of the present invention, a circuit for selectively connecting between the pad and the package pin can be arranged at plural positions, because it needs not be arranged adjacent to such terminals (e.g. the VDD terminal, the RESET terminal) as an existing and fixed-potential terminal and a specific external terminal whose potential changes during the operation mode setting period. It is therefore possible to arrange a lot of operation mode switch pads without restricted by specification of product terminals or pad layout design. It is thus possible to prepare many operation modes.

The semiconductor device of the present invention can also be applied to a BGA (Ball Grid Array) package and so forth.

It is apparent that the present invention is not limited to the above embodiments and may be modified and changed without departing from the scope and spirit of the invention.

The invention claimed is:

1. A semiconductor device, comprising:
   an internal terminal;
   a first transistor of a first conductivity type that is coupled between a first reference potential and the internal terminal, and that includes a first control terminal;
   a second transistor of a second conductivity type that is coupled between a second reference potential and the internal terminal, and that includes a second control terminal;
   an oscillator that includes an output terminal to output a clock signal; and
   a comparator that is coupled to the internal terminal, and that compares a potential of the internal terminal when the internal terminal is coupled to the first reference potential with a potential of the internal terminal when the internal terminal is coupled to the second reference potential,
   wherein each of the first and second control terminals is coupled to the output terminal to commonly receive the clock signal, and
   wherein the first and second transistors exclusively operate in response to the clock signal,
   wherein the internal terminal comprises a first internal terminal,
   wherein the comparator comprises a first comparator,
   wherein the semiconductor device further comprises:
      a second internal terminal;
      a third transistor of the first conductivity type that is coupled between the first reference potential and the second internal terminal, and that includes a third control terminal;
      a fourth transistor of the second conductivity type that is coupled between the second reference potential and the second internal terminal, and that includes a fourth control terminal;
      a second comparator that is coupled to the second internal terminal, and that compares a potential of the second internal terminal when the second internal terminal is coupled to the first reference potential with a potential of the second internal terminal when the second internal terminal is coupled to the second reference potential; and
      an internal circuit,
   wherein each of the third and fourth control terminals is coupled to the output terminal to commonly receive the clock signal,
   wherein the third and fourth transistors exclusively operate in response to the clock signal, and
   wherein the internal circuit determines an operation mode based on an output of the first comparator and an output of the second comparator.

2. The semiconductor device according to claim 1, wherein the oscillator comprises a first oscillator,
   wherein the clock signal comprises a first clock signal,
   wherein the semiconductor device further comprises:
      a second oscillator that is coupled to the first oscillator to supply a second clock signal; and
      a memory that is coupled between the internal terminal and the comparator,
   wherein a frequency of the second clock signal is faster than that of the first clock signal, and
   wherein the memory takes in the potential of the internal terminal in response to the second clock signal to output the potential of the terminal taken in to the comparator.

3. The semiconductor device according to claim 2, wherein the first oscillator frequency-divides the second clock signal to generate the first clock signal.

4. The semiconductor device according to claim 1, further comprising:
   an external terminal that is connectable to the internal terminal.

5. A semiconductor device, comprising:
   an internal terminal;
   a first transistor of a first conductivity type that is coupled between a first reference potential and the internal terminal, and that includes a first control terminal;
   a second transistor of a second conductivity type that is coupled between a second reference potential and the internal terminal, and that includes a second control terminal;
   an oscillator that includes an output terminal to output a clock signal;
   a comparator that is coupled to the internal terminal, and that compares a potential of the internal terminal when the internal terminal is coupled to the first reference potential with a potential of the internal terminal when the internal terminal is coupled to the second reference potential;

an external terminal that is connectable to the internal terminal;
an internal circuit;
and an input/output circuit that is coupled between the internal terminal and the internal circuit,
wherein each of the first and second control terminals is coupled to the output terminal to commonly receive the clock signal, and
wherein the first and second transistors exclusively operate in response to the clock signal, and
wherein the input/output circuit controls a connection configuration between the internal terminal and the internal circuit based on an output of the comparator.

6. The semiconductor device according to claim 5, wherein the oscillator comprises a first oscillator,
wherein the clock signal comprises a first clock signal,
wherein the semiconductor device further comprises:
a second oscillator that is coupled to the first oscillator to supply a second clock signal; and
a memory that is coupled between the internal terminal and the comparator,
wherein a frequency of the second clock signal is faster than that of the first clock signal, and
wherein the memory takes in the potential of the internal terminal in response to the second clock signal to output the potential of the terminal taken in to the comparator.

7. The semiconductor device according to claim 6, wherein the first oscillator frequency-divides the second clock signal to generate the first clock signal.

8. A semiconductor device, comprising:
an internal terminal;
a first transistor of a first conductivity type that is coupled between a first reference potential and the internal terminal, and that includes a first control terminal;
a second transistor of a second conductivity type that is coupled between a second reference potential and the internal terminal, and that includes a second control terminal;
an oscillator that includes an output terminal to output a clock signal; and
a comparator that is coupled to the internal terminal, and that compares a potential of the internal terminal when the internal terminal is coupled to the first reference potential with a potential of the internal terminal when the internal terminal is coupled to the second reference potential, wherein each of the first and second control terminals is coupled to the output terminal to commonly receive the clock signal, and
wherein the first and second transistors exclusively operate in response to the clock signal,
wherein the internal terminal comprises a first internal terminal,
wherein the semiconductor device further comprises:
an internal circuit; and
a second internal terminal that receives a reset signal, and that is coupled to the internal circuit, and
wherein the internal circuit determines, based on an output of the comparator, an operation mode during a reset period in accordance with the reset signal.

9. The semiconductor device according to claim 8, further comprising an external terminal that is connectable to the internal terminal.

10. The semiconductor device according to claim 8, wherein the oscillator comprises a first oscillator,
wherein the clock signal comprises a first clock signal,
wherein the semiconductor device further comprises:
a second oscillator that is coupled to the first oscillator to supply a second clock signal; and
a memory that is coupled between the internal terminal and the comparator,
wherein a frequency of the second clock signal is faster than that of the first clock signal, and
wherein the memory takes in the potential of the internal terminal in response to the second clock signal to output the potential of the terminal taken in to the comparator.

11. The semiconductor device according to claim 10, wherein the first oscillator frequency-divides the second clock signal to generate the first clock signal.

12. A semiconductor device, comprising:
an internal terminal;
a first transistor of a first conductivity type that is coupled between a first reference potential and the internal terminal, and that includes a first control terminal;
a second transistor of a second conductivity type that is coupled between a second reference potential and the internal terminal, and that includes a second control terminal;
an oscillator that includes an output terminal to output a clock signal; and
a comparator that is coupled to the internal terminal, and that compares a potential of the internal terminal when the internal terminal is coupled to the first reference potential with a potential of the internal terminal when the internal terminal is coupled to the second reference potential,
wherein each of the first and second control terminals is coupled to the output terminal to commonly receive the clock signal, and
wherein the first and second transistors exclusively operate in response to the clock signal,
wherein the internal terminal comprises a first internal terminal, wherein the comparator comprises a first comparator,
wherein the semiconductor device further comprises:
a second internal terminal;
a third transistor of the first conductivity type that is coupled between the first reference potential and the second internal terminal, and that includes a third control terminal;
a fourth transistor of the second conductivity type that is coupled between the second reference potential and the second internal terminal, and that includes a fourth control terminal;
a second comparator that is coupled to the second internal terminal, and that compares a potential of the second internal terminal when the second internal terminal is coupled to the first reference potential with a potential of the second internal terminal when the second internal terminal is coupled to the second reference potential;
an internal circuit; an input/output circuit that is coupled to the first internal terminal, the second internal terminal, and the internal circuit; and
an external terminal that is connectable to the first and second internal terminals,
wherein each of the third and fourth control terminals is coupled to the output terminal to commonly receive the clock signal,
wherein the third and fourth transistors exclusively operate in response to the clock signal,
wherein the internal circuit determines an operation mode based on an output of the first comparator and an output of the second comparator, and wherein the input/output circuit controls a connection configuration between the first internal terminal and the internal circuit based on the output of the first comparator, and a connection configuration between the second internal terminal and the internal circuit based on the output of the second comparator.

13. The semiconductor device according to claim 12, further comprising an external terminal that is connectable to the internal terminal.

14. The semiconductor device according to claim 12, wherein the oscillator comprises a first oscillator,
wherein the clock signal comprises a first clock signal,
wherein the semiconductor device further comprises:
   a second oscillator that is coupled to the first oscillator to supply a second clock signal; and
   a memory that is coupled between the internal terminal and the comparator,
wherein a frequency of the second clock signal is faster than that of the first clock signal, and
wherein the memory takes in the potential of the internal terminal in response to the second clock signal to output the potential of the terminal taken in to the comparator.

15. The semiconductor device according to claim 14, wherein the first oscillator frequency-divides the second clock signal to generate the first clock signal.

* * * * *